(12) United States Patent  
Suzuki

(10) Patent No.: US 6,603,351 B2  
(45) Date of Patent: Aug. 5, 2003

(54) POWER AMPLIFIER WITH GAIN CHANGE COMPENSATION

(75) Inventor: Yasuyuki Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/968,559

(22) Filed: Oct. 1, 2001

(65) Prior Publication Data

US 2002/0039047 A1 Apr. 4, 2002

(30) Foreign Application Priority Data

Oct. 3, 2000 (JP) ...................................... 2000-303536

(51) Int. Cl.[7] ................................................. H03G 5/16
(52) U.S. Cl. ........................ 330/133; 330/302; 330/311
(58) Field of Search ................................ 330/133, 134, 330/285, 302

(56) References Cited

U.S. PATENT DOCUMENTS 5,903,854 A * 5/1999 Abe et al. .................... 330/295  
5,986,503 A * 11/1999 Ichikawa .................... 330/296  
6,236,266 B1 * 5/2001 Choumei et al. ........... 330/133  
6,356,745 B1 * 3/2002 Lee et al. .................... 330/129

FOREIGN PATENT DOCUMENTS

JP 07-245529 9/1995

* cited by examiner

Primary Examiner—Robert Pascal  
Assistant Examiner—Khanh Van Nguyen  
(74) Attorney, Agent, or Firm—Choate, Hall & Stewart

(57) ABSTRACT

A high-frequency power amplifier is provided, which suppresses effectively the distortion induced by gain deviation or fluctuation occurring in at least one of the amplifier stages without using the back-off of the operating point. The amplifier comprises first to n-th amplifier stages connected in cascade, where n is an integer greater than unity. A k-th one of the amplifier stages receives a k-th input signal power to produce a k-th output signal power, where k is an integer satisfying a relationship of $1 \leq k \leq n$. The k-th amplifier stage includes a transistor with an amplification function. The transistor has a gain change in a range of the k-th input signal power or the k-th output signal power. A m-th one of the amplifier stages receives a m-th output signal to produce a m-th output signal, where m is an integer satisfying a relationship of $1 \leq m \leq n$ and $m \neq k$. The m-th amplifier stage includes a transistor with an amplification function. The transistor has a gain change in a range of the m-th input signal power or the m-th output signal power. The gain change of the transistor of the m-th amplifier stage is decreased or cancelled by the gain change or the transistor of the k-th amplifier stage.

18 Claims, 9 Drawing Sheets

POWER AMPLIFIER WITH GAIN CHANGE COMPENSATION

BACKGROUND OF THE INVENTION

1. Field of the Invention

The present invention relates to a power amplifier for amplifying an input power to produce an output power using transistors. More particularly, the invention relates to a power amplifier comprising cascade-connected amplifier stages that realizes distortion decrease and efficiency increase with respect to signals in the Ultra High Frequency (UHF) band (e.g., 300 to 3000 MHz) to the microwave band (e.g., 1 to 1000 GHz) or millimeter wave band (e.g., 30 to 300 GHz).

2. Description of the Related Art

Recently, mobile or cellular phones have been becoming popular in the mobile communication field and thus, the need for power amplifiers as one of their key devices has been increasing rapidly. Transmitting power amplifiers designed for digital cellular phones need to have characteristics that satisfy high output power, high amplification efficiency, and low distortion. Transmitting power amplifiers are usually formed by high-frequency, high-output bipolar transistors or high-frequency, high-output Metal-Semiconductor Field-Effect Transistors (MESFETs).

Generally, high-frequency, high-output transistors have the following input-output characteristics:

Specifically, the output signal of a high-frequency, high-output transistor increases linearly according to the increase of the input signal when the input signal is low in level. In this case, the range of the linear input-output characteristic is termed the "linear region". In other words, the transistor is operating in the "linear region", where distortion is kept in low level.

On the other hand, when the input signal is sufficiently high in level, the output signal of a high-frequency, high-output transistor does not increase linearly according to the increase of the input signal and as a result, the increasing rate of the output signal decreases or saturates. In this case, the range of the input-output characteristic is termed the "saturation region". The increasing rate decrease of the output signal is termed the "gain compression". In tho saturation region, the distortion contained in the output signal of a high-frequency, high-output transistor increases.

Therefore, when a multistage power amplifier is configured with high-frequency, high-output transistors to decrease the output signal distortion, conventionally, the operating point of each of the high-frequency, high-output transistors is located at a position on the load line that is back off the saturation region by several decibels (dB). This means that each transistor is operated in a region as close to the linear region as possible, thereby suppressing the distortion in amplification behavior.

With the above-described conventional multistage power amplifier of this type, the back-off amount of each transistor is increased up to a specific level to decrease the distortion in the output signal and therefore, each transistor needs to have a saturation output power enough for maintaining the linearity at the maximum transmission power. This leads to a disadvantage that each transistor needs to have a considerably large size, which raises the cost of the amplifier as well.

Moreover, the obtainable power addition efficiency at an operating point of each transistor backed off the saturation region is less than that at an operating point where the saturation output power is derived. Therefore, there is another problem that each transistor (and therefore, the power amplifier) consumes extra power; i.e., the power efficiency of the amplifier decreases.

The Japanese Non-Examined Patent Publication No. 7-245529 published in 1995 discloses low phase-distortion power amplifiers. A first one of the amplifiers disclosed comprises an amplifier stage with a common-gate Field-Effect Transistor (FET) and an opposite-phase generator stage with a common-source FET. The common-source FET in the opposite-phase generator stage provides a phase change opposite to that of the common-gate FET in the amplifier stage, thereby canceling the phase distortion of the power amplifier. The amplifier stage with the common-gate FET is located prior or next to the opposite-phase generator stage with the common-source FET.

A second one of the amplifier circuits disclosed by the Publication No. 7-245529 comprises an amplifier stage with a common-source FET and an opposite-phase generator stage with a common-gate FET. The common-gate FET in the opposite-phase generator stage provides a phase change opposite to that of the common-source FET in he amplifier stage, thereby canceling the phase distortion of the power amplifier. The amplifier stage with the common-source FET is located prior or next to the opposite-phase generator stage with the common-gate FET.

With the prior-art power amplifiers disclosed by the Publication No. 7-245529, the opposite-phase generator stage compensates or cancels only the "phase distortion". Thus, the technique disclosed by the Publication No. 7-245529 is unable to suppress or prevent the distortion induced by the gain deviation or fluctuation in the amplifier stage.

SUMMARY OF THE INVENTION

Accordingly, an object of the present invention is to provide a high-frequency power amplifier having cascade-connected amplifier stages that realizes simultaneously low distortion and high efficiency even when the input or output signal power is near its peak.

Another object of the present invention is to provide a high-frequency power amplifier having cascade-connected amplifier stages that suppresses effectively the distortion induced by gain deviation or fluctuation occurring in at least one of the amplifier stages without using the back-off of the operating point.

Still another object of the present invention is to provide a high-frequency power amplifier having cascade-connected amplifier stages that increases the power addition efficiency while suppressing the distortion.

The above objects together with others not specifically mentioned will become clear to those skilled in the art from the following description.

A high-frequency power amplifier according to the invention comprises:

(a) first to n-th amplifier stages connected in cascade, where n is an integer greater than unity;

(b) a k-th one of the amplifier stages receiving a k-th input signal power to produce a k-th output signal power, where k is an integer satisfying a relationship of $1 \leq k \leq n$;

the k-th amplifier stage including a transistor with an amplification function;

the transistor having a gain change in a range of the k-th input signal power or the k-th output signal power;

(c) a m-th one of the amplifier stages receiving a m-th output signal to produce a m-th output signal, where m is an integer satisfying a relationship of $1 \leq m \leq n$ and $m \neq k$;

the m-th amplifier stage including a transistor with an amplification function;

the transistor having a gain change in a range of the m-th input signal power or the m-th output signal power; and (d) the gain change of the transistor of the m-th amplifier stage being decreased or cancelled by the gain change of the transistor of the k-th amplifier stage.

With the high-frequency power amplifier according to the invention, the transistor of the k-th amplifier stage has a gain change in a range of the k-th input signal power or the k-th output signal power. The transistor of the m-th amplifier stage has a gain change in a range of the m-th input signal power or the mth output signal power. The gain change of the transistor of the m-th amplifier stage is decreased or cancelled by the gain change of the transistor of the k-th amplifier stage Therefore, the distortion induced by gain deviation or fluctuation occurring in at lease one of the first to n-th amplifier stages is suppressed effectively without using the back-off. This means that low distortion and high efficiency can be realized simultaneously even when the input or output signal power is near its peak.

Since the back-off is unnecessary, a conventional high-efficiency transistor (which has a gain compression near the peak of its input or output signal power) can be used for the transistor of the k-th or m-th amplifier stage. Thus, the power addition efficiency (and therefore, the output signal power) is increased while suppressing the distortion.

In a preferred embodiment of the amplifier according to the invention, the transistor of the k-th amplifier stage has a gain increase in the range of the k-th input signal power or the k-th output signal power while the transistor of the m-th amplifier stage has a gain compression.

In this embodiment, it is preferred that each of the transistors of the k-th and m-th amplifier stages is a bipolar transistor with common-emitter configuration. Also, the gain change of the transistor of the k-th amplifier stage is preferably caused by changing its base bias current.

Alternately, each of the transistors of the k-th and m-th amplifier stages may be a FET with common-source configuration. The gain change of the transistor of the k-th amplifier stage is preferably caused by changing its gate bias voltage.

In another preferred embodiment of the amplifier according to the invention, a gain controller is additionally provided for controlling a gain of the transistor of the k-th amplifier stage responsive to the k-th output signal power or a n-th output signal power produced by the n-th amplifier stage.

In this embodiment, it is preferred that the transistor of the k-th amplifier stage is a bipolar transistor with common-emitter configuration. Preferably, the gain controller controls a base bias current of the transistor of the k-th amplifier stage.

In still another preferred embodiment of the amplifier according to the invention, relationships of $m=k+1$ and $1 \leq k \leq (n-1)$ are satisfied.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
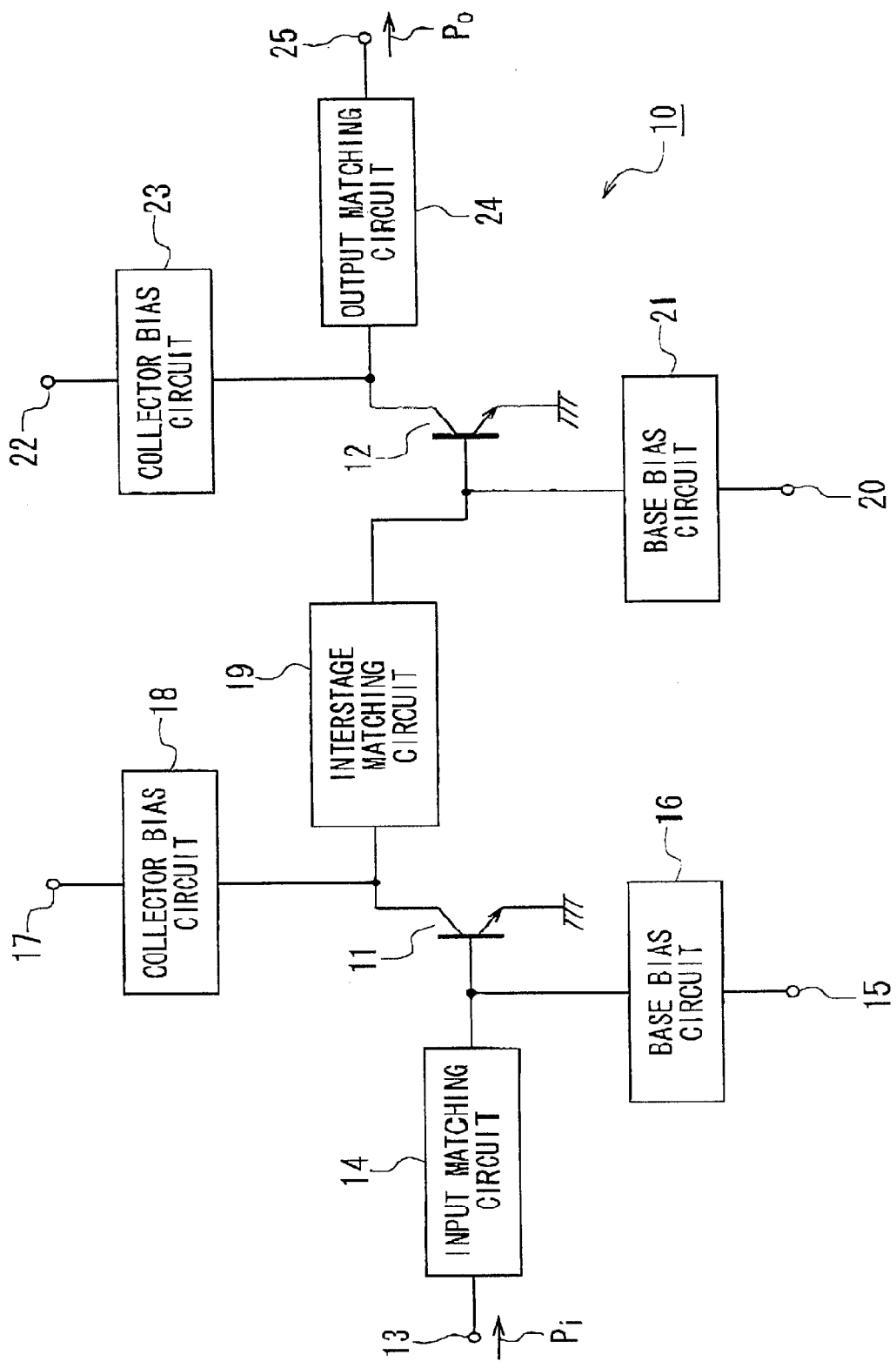
FIG. 1 is a functional block diagram showing the configuration of a high-frequency power amplifier according to a first embodiment of the invention, in which bipolar transistors are used for the first and second amplifier stages.

Preferred embodiments of the present invention will be described in detail below while referring to the drawings attached.

First Embodiment

As shown in FIG. 1, a high-frequency power amplifier 10 according to a first embodiment the invention comprises a first amplifier stage having a npn bipolar transistor 11 and a second amplifier stage having a npn bipolar transistor 12. The first and second amplifier stages are connected to each other by way of an interstage matching circuit 19 for impedance matching between these stages. The amplifier 10 receives an input signal power (input power) Pi at an input terminal 13 to amplify the same at the first and second amplifier stages, generating an output signal power (output power) Po at an output terminal 25. Here, each of the transistors 11 and 12 has a common-emitter configuration and serves as an amplifier.

Moreover, the power amplifier 10 comprises an input matching circuit 14, a base bias circuit 16, and a collector bias circuit 18 in the first amplifier stage. The input matching circuit 14, which is provided between the input terminal 13 and the base of the transistor 11, serves to match the input impedance of the amplifier 10 to the signal source impedance of the input power Pi. The base bias circuit 16, which is provided between a base bias terminal 15 and the base of the transistor 11, supplies a base bias current to the base of the transistor 11. The collector bias circuit 18, which is provided between a collector bias terminal 17 and the collector of the transistor 11, supplies a collector bias current to the collector of the transistor 11.

Similarly, the amplifier 10 further comprises a base bias circuit 21, a collector bias circuit 23, and an output matching circuit 24 in the second amplifier stage. The base bias circuit 21, which is provided between a base bias terminal 20 and the base of the transistor 12, supplies a base bias current to the base of the transistor 12. The collector bias circuit 23, which is provided between a collector bias terminal 22 and the collector of the transistor 12, supplies a collector bias current to the collector of the transistor 12. The output matching circuit 24, which is provided between the collector of the transistor 12 and the output terminal 25, serves to match the output impedance of the amplifier 10 to the input impedance of a circuit or device (not shown) that receives the output power Po.

The interstage matching circuit 19 is provided between the collector of the transistor 11 (i.e., the output terminal of the first stage) and the base of the transistor 12 (i.e., the input terminal of the second stage).

Each of the matching circuits 14, 19, and 24 and the bias circuits 16, 18, 21, and 23 is formed mainly by passive elements or components such as resistors, capacitors, and inductors.

Next, the operation of the power amplifier 10 according to the first embodiment will be explained with reference to FIGS. 2 to 4.

In summary, the amplifier 10 operates in such a way that the change of the gain of the transistor 12 at the second amplifier stage is suppressed or canceled by the change of the gain of the transistor 11 at the first amplifier stage within a specific range of the input power Pi. In other words, within a specific range of the input power Pi, the gain of the transistor 11 increases and the gain of the transistor 12 decreases as the input power Pi increases, thereby suppressing or canceling the gain compression of the transistor 12 in the specific range of Pi.

The above-described operation of the power amplifier 10 is realized by the following reason.

Figure 2:
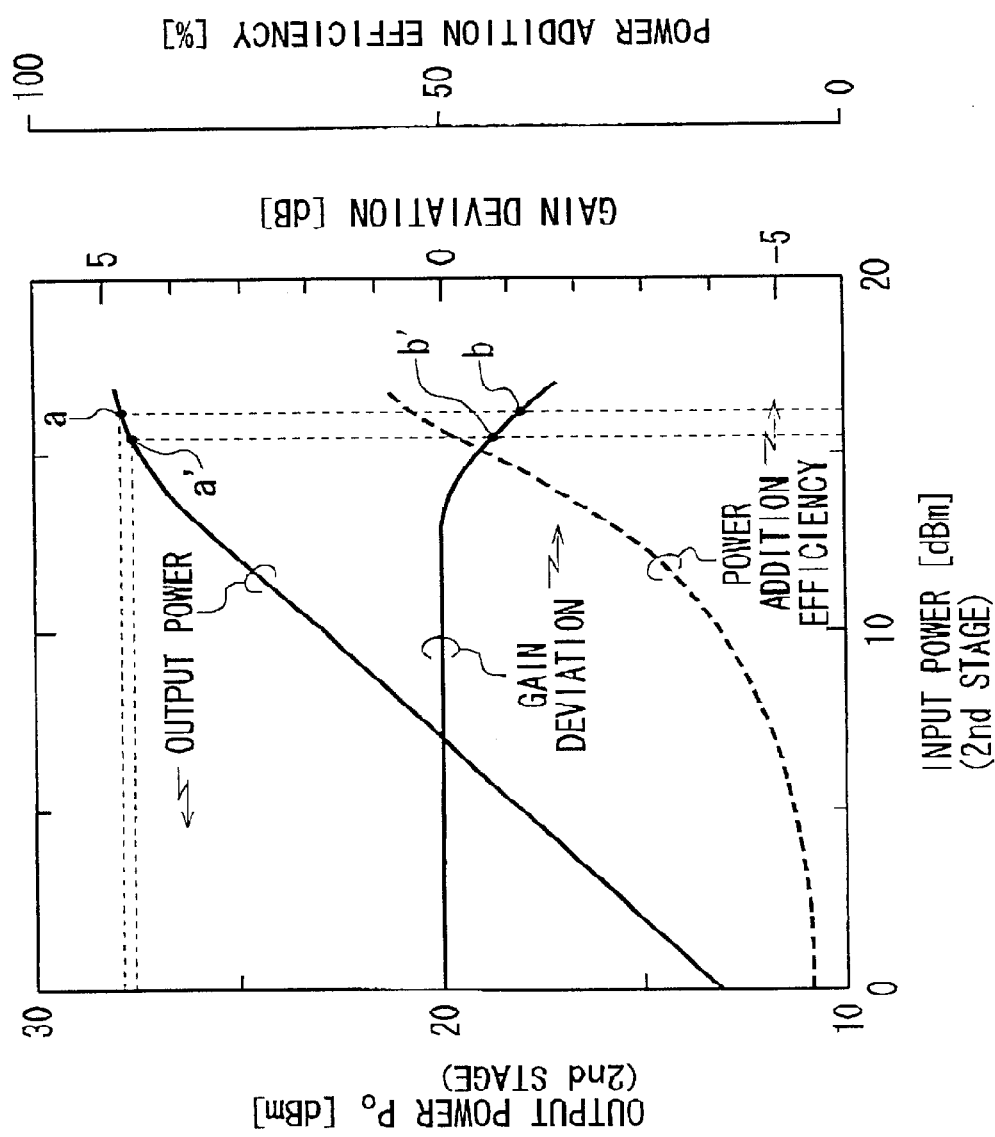
FIG. 2 is a graph showing the input-output, power addition efficiency, and gain deviation characteristics of the second amplifier stage of the power amplifier according to the first embodiment of FIG. 1.

FIG. 2 shows the input-output, the power addition efficiency, and the gain deviation characteristics of the transistor 12 at the second stage. FIG. 3 shows the input-output and the gain deviation characteristics of the transistor 11 at the first stage. FIG. 4 shows the input-output and the gain deviation characteristics of the power amplifier 10 according to the first embodiment, which is the combination of the characteristics of FIGS. 2 and 3.

On operation, the second amplifier stage comprising the transistor 12 has the characteristics shown in FIG. 2, where the frequency of the input signal power for the transistor 12 is set at 950 MHz and the base bias current density (i.e., the setting bias current density) supplied by the base bias circuit 21 is set at $2.0 \times 10^3$ A/cm$^2$. To ensure both higher power addition efficiency and lower distortion, the operating point of the transistor 12 on the load line is set at a point in such a way that the transistor 12 is in the class AB amplification operation. No back-off is applied to the operating point of the transistor 12.

The gain deviation is kept zero when the input signal power Pi is less than approximately 13 dBm. However, when the input signal power is equal to approximately 13 dBm or greater, the gain of the transistor 12 (i.e., the second amplifier stage) decreases. This will be easily understood from the fact that the output power and gain deviation curves are bent downward near their right-hand ends in FIG. 2. This means that gain compression (i.e., negative gain deviation) occurs in the vicinity of the peaks of the input power for the transistor 12 and the output power Po. In other words, gain compression occurs when the transistor 12 enters its saturation region. As seen from FIG. 2, the "gain compression" is more than 1 dBm when the output power Po is approximately 28 dBm.

To ensure a desired high output power Po to be derived from the output terminal 25, the size of the transistor 12 in the second stage is formed to be approximately eight times as much as that of the transistor 11 in the first stage.

Figure 3:
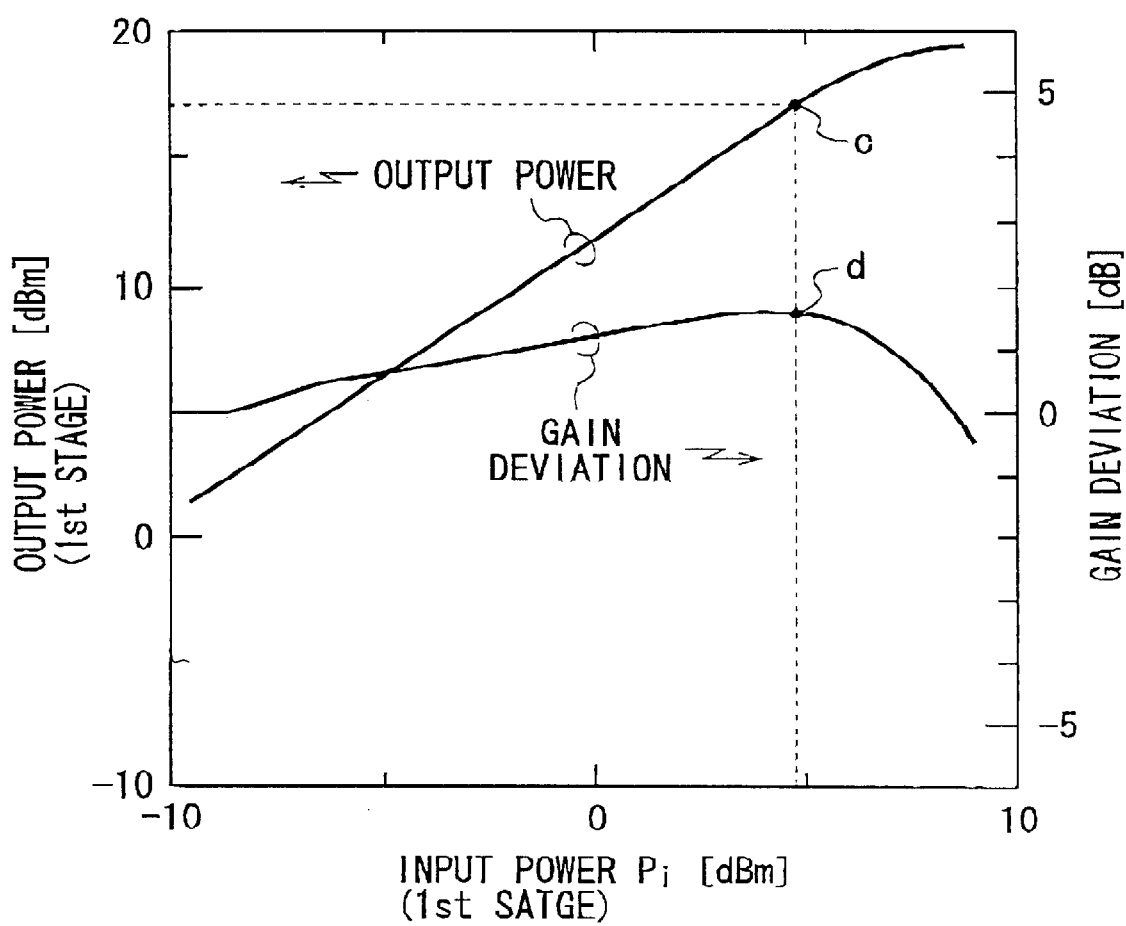
FIG. 3 is a graph showing the input-output and gain deviation characteristics of the first amplifier stage of the power amplifier according to the first embodiment of FIG. 1.

On the other hand, the first amplifier stage comprising the transistor 11 has the characteristics shown in FIG. 3, where the frequency of the input signal power Pi for the transistor 11 (i.e., for the amplifier 10) is set at the same frequency of 950 MHz as the transistor 12 at the second amplifier stage. However, the base bias current density (i.e., the setting bias current density) supplied to the transistor 12 by the base bias circuit 16 is set as low as $5.0 \times 10^2$ A/cm$^2$, which is one-fourth (¼) of the base bias current density for the transistor 12. Thus, as seen from the gain deviation curve of FIG. 3, the gain of the transistor 11 increases linearly until the input power Pi is equal to 5 dBm from zero. Responsive to this gain increase, as seen from the output power curve of FIG. 3, the output power of the transistor 11 increases linearly from approximately zero to approximately 16 dBm.

The transistor 11 at the first amplifier stage also is in the class AB amplification operation to ensure both high power addition efficiency and low distortion. Like the transistor 12, no back-off is applied to the operating point of the transistor 11.

Figure 4:
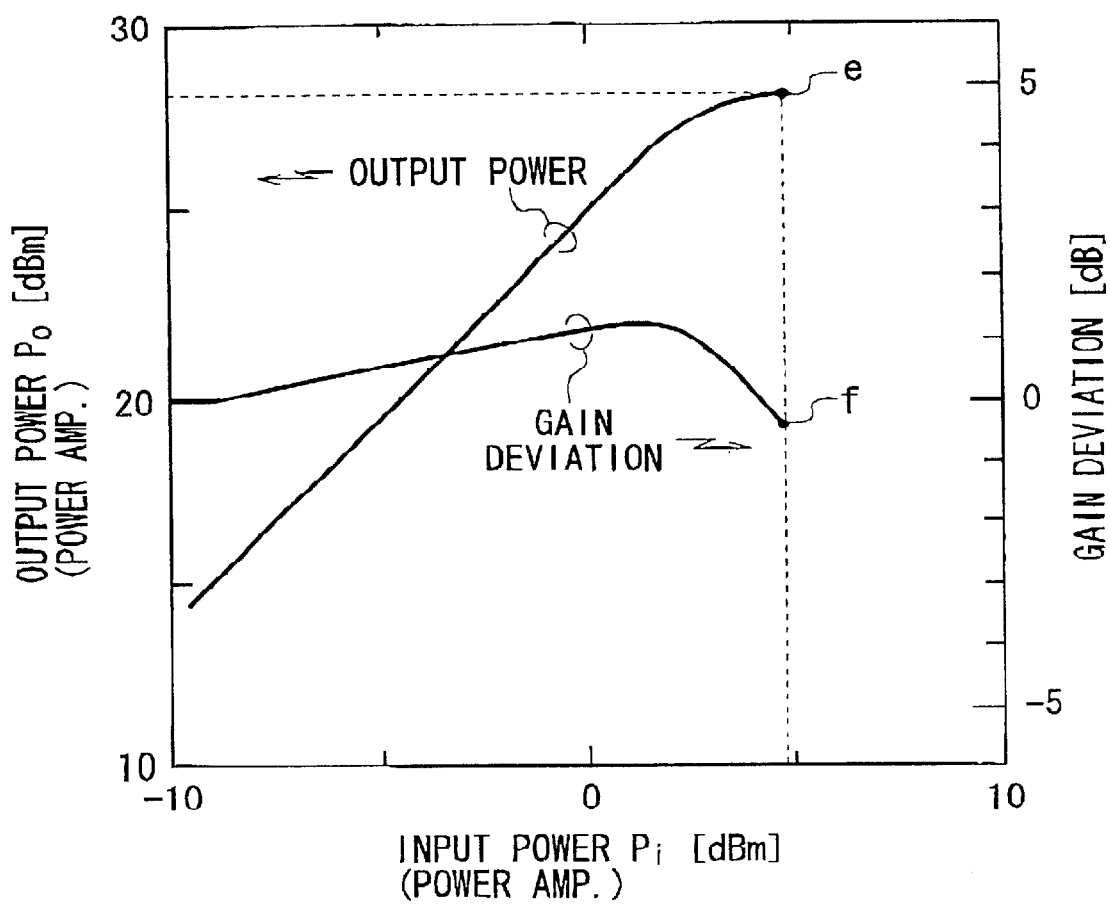
FIG. 4 is a graph showing the overall input-output and gain deviation characteristics of the power amplifier according to the first embodiment of FIG. 1.

The power amplifier 10 according to the first embodiment is the combination of the transistors 11 and 12 (i.e., the first and second amplifier stages) and therefore, it has the input-output and gain deviation characteristics, as shown in FIG. 4. The reason is explained below.

When the input power Pi for the power amplifier 10 is approximately 5 dBm, the transistor 11 at the first amplifier stage has a gain increase of approximately 1.5 dBm, as shown by the point d on the gain deviation curve in FIG. 3. At this time, the output power of the transistor 11 is approximately 16 dBm, as shown by the point c on the output power curve in FIG. 3.

On the other hand, when the output power of the transistor 11 of approximately 16 dBm or greater is applied to the transistor 12 at the second amplifier stage, the output power Po of the second amplifier stage (i.e., the amplifier 10) is approximately 28 dBm or greater. At this time, the transistor 12 has a gain compression of more than 1.0 dBm. These are seen from the points a and b in FIG. 2.

In the amplifier 10, as shown by the points e and f in FIG. 4, the overall gain compression of the amplifier 10 is suppressed to approximately 0.5 dBm or less even when the output power Po it at the maximum value of approximately 28.2 dBm. Thus, the distortion induced by the gain deviation or fluctuation of the first and second amplifier stages is suppressed or compensated effectively.

As described above, with the power amplifier 10 of the first embodiment, the gain compression of more than 1.0 dBm of the transistor 12 at the second stage is combined with the gain increase of approximately 1.5 dBm of the transistor 11 at the first stage, when the output power Po of the amplifier 10 is near its peak region (i.e., approximately 28 dBm or greater). As a result, the gain compression of more than 1.0 dBm of the transistor 12 is decreased by the gain increase of approximately 1.5 dBm of the transistor 11, which means that the linearity of the amplifier 10 is improved. Thus, the distortion caused by the gain deviation (i.e., gain compression) of the transistor 12 at the second stage is suppressed effectively.

Because the emitted area of the transistor 12 at the second stage is approximately eight times as that of time transistor 11 at the first stage, the power addition efficiency of the amplifier 10 is strongly dependent upon the characteristics of the second stage. Also, the gain compression at the second stage is suppressed or cancelled as described above and thus, the distortion is suppressed even when the input and output powers Pi and Po are near their peaks. Moreover, since the distortion caused by gain compression at the second stage is effectively suppressed or compensated, back-off is unnecessary for the second stage. Thus, the output power Po is enhanced while keeping low distortion. As a result, both the power addition efficiency and the output power Po are enhanced.

With the power amplifier 10 according to the first embodiment, as explained above in detail, the bias current density Jc for the transistor 11 at the first amplifier stage is set at a specific low value, thereby producing a gain increase of the first-stage transistor 11 in the high-power range where the second-stage transistor 12 exhibits a gain compression. Thus, the overall gain compression of the amplifier 10 can be effectively suppressed or canceled, which means that the output power Po of the amplifier 10 is increased.

Second Embodiment

Figure 5:
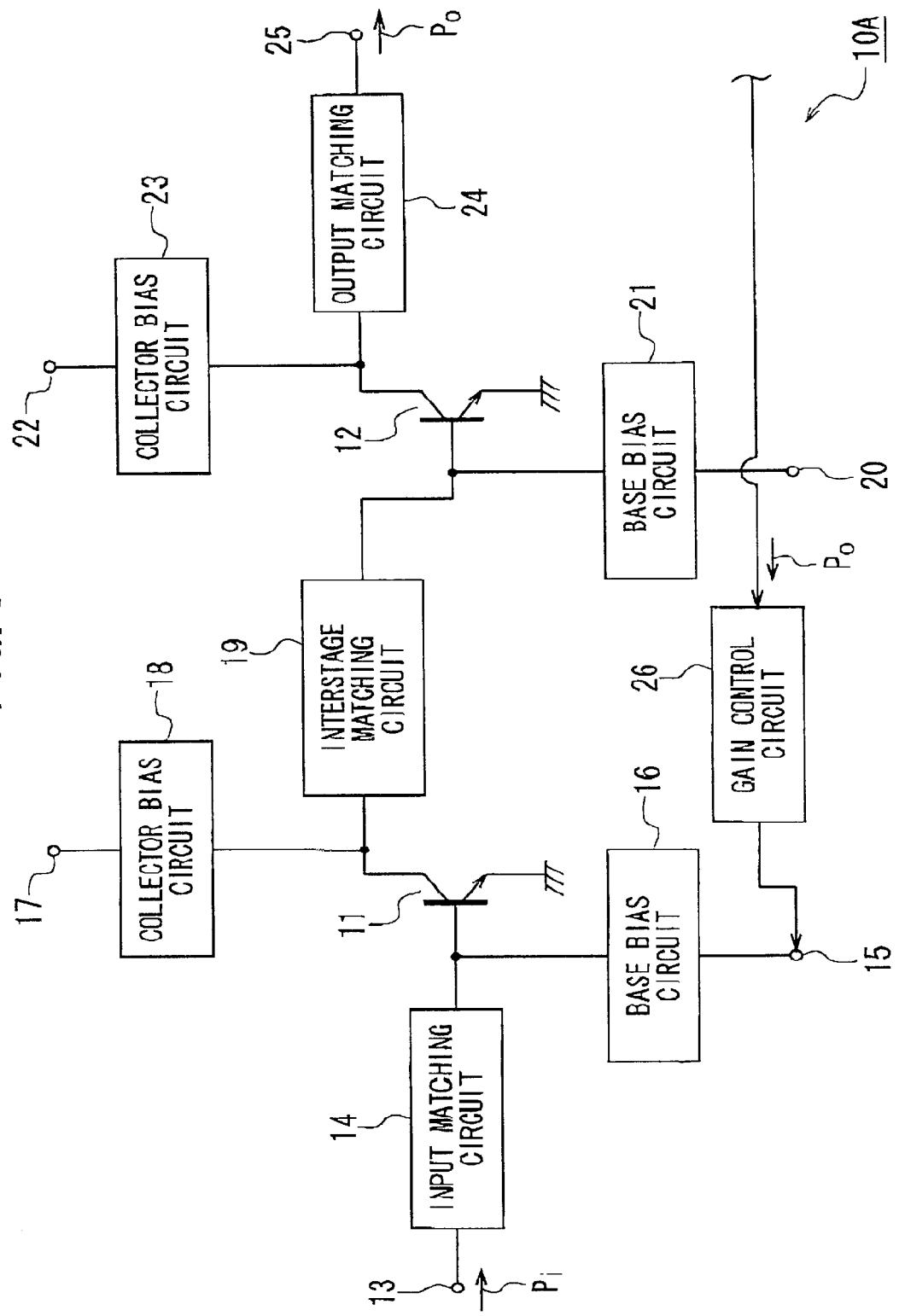
FIG. 5 is a functional block diagram showing the configuration of a high-frequency power amplifier according to a second embodiment of the invention, in which bipolar transistors are used for the first and second amplifier stages and a gain control circuit is provided.

FIG. 5 shows the configuration of a high-frequency power amplifier 10A according to a second embodiment, which comprises the same configuration as the power amplifier 10 according to the first embodiment of FIG. 1 except that a gain control circuit 26 for controlling the gain of the first-stage transistor 11 is additionally provided. Therefore, the explanation about the same configuration is omitted here for the sake of simplification by attaching the same reference symbols or numerals as those in the first embodiment to the same elements in FIG. 5.

Next, the operation of the power amplifier 10A according to the second embodiment is explained below with reference to FIGS. 2 and 6 to 7.

Figure 6:
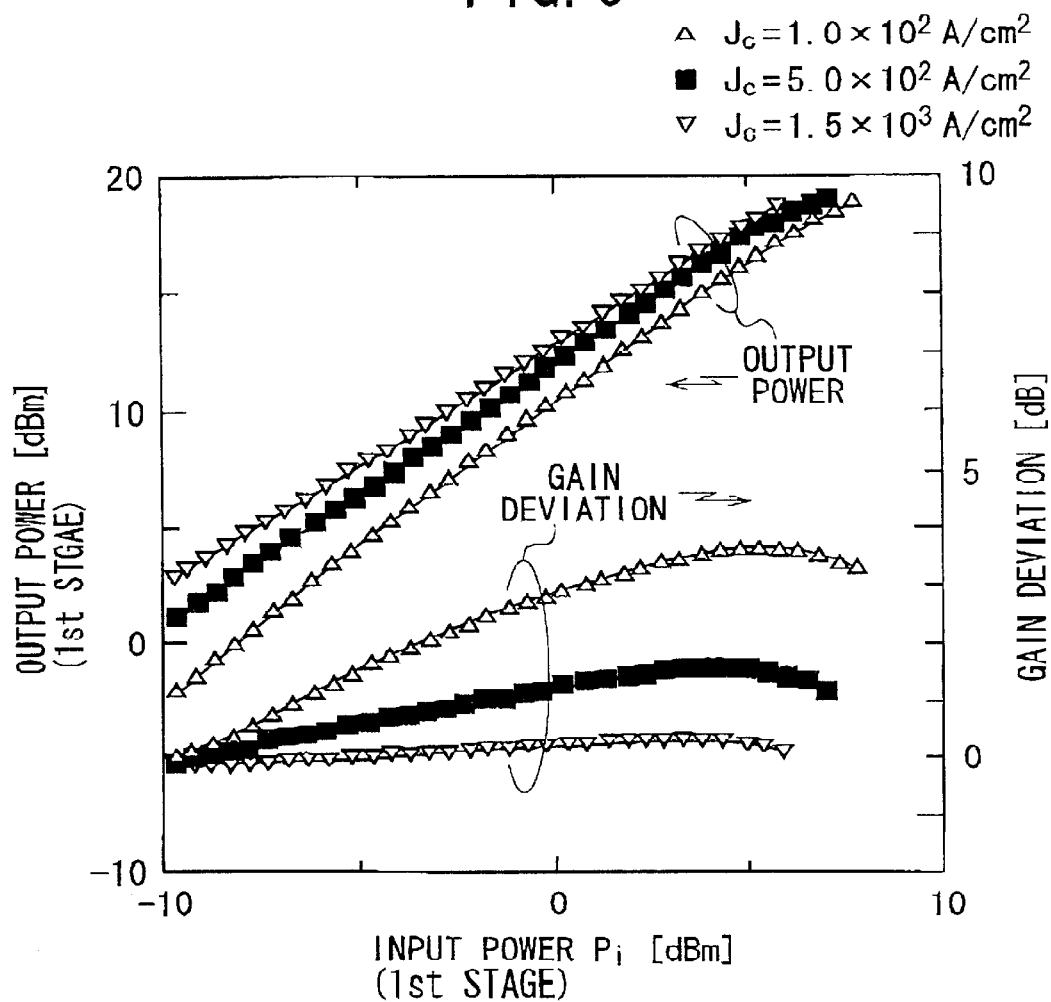
FIG. 6 is a graph showing the input-output and gain deviation characteristics of the first amplifier stage of the power amplifier according to the second embodiment of FIG. 5.

FIG. 6 shows the input-output and gain deviation characteristics of the transistor 11 at the first stage. FIG. 7 shows the relationship of the gain increase with the base bias current density Jc for the transistor 31, where the output power is set at 16 dBm or 15 dBm.

The second amplifier stage comprising the transistor 12 has the same characteristics at the frequency of 950 MHz as those of the power amplifier 10 of the first embodiment shown in FIG. 2. Like the first embodiment, the base bias current density for the transistor 12, which is supplied by the base bias circuit 21, is set as $2.0 \times 10^3$ A/cm$^2$. Like the first embodiment, the transistor 12 is in the class AB amplification operation to ensure both high power addition efficiency and low distortion. As seen from FIG. 2, gain compression occurs when the input power for the transistor 12 is approximately 13 dBm or greater. The gain compression is more than 1 dBm when the output power Po of the transistor 12 (i.e., the power amplifier 10A) is approximately 28 dBm.

The gain control circuit 26 operates to change or adjust the base bias current density Jc supplied by the base bias circuit 16 to the first-stage transistor 11. As seen from FIG. 6, the output power and the gain deviation of the transistor 11 vary if the base bias current density Jc is changed by the circuit 26 from $1.5 \times 10^3$ A/cm$^2$ to $1.0 \times 10^2$ A/cm$^2$. This means that the gain of the transistor 11 is controlled or adjusted by the circuit 26 within a considerably wide range. For example, the circuit 26 realizes its gain control function by changing the voltage value at the base bias terminal 15.

Figure 7:
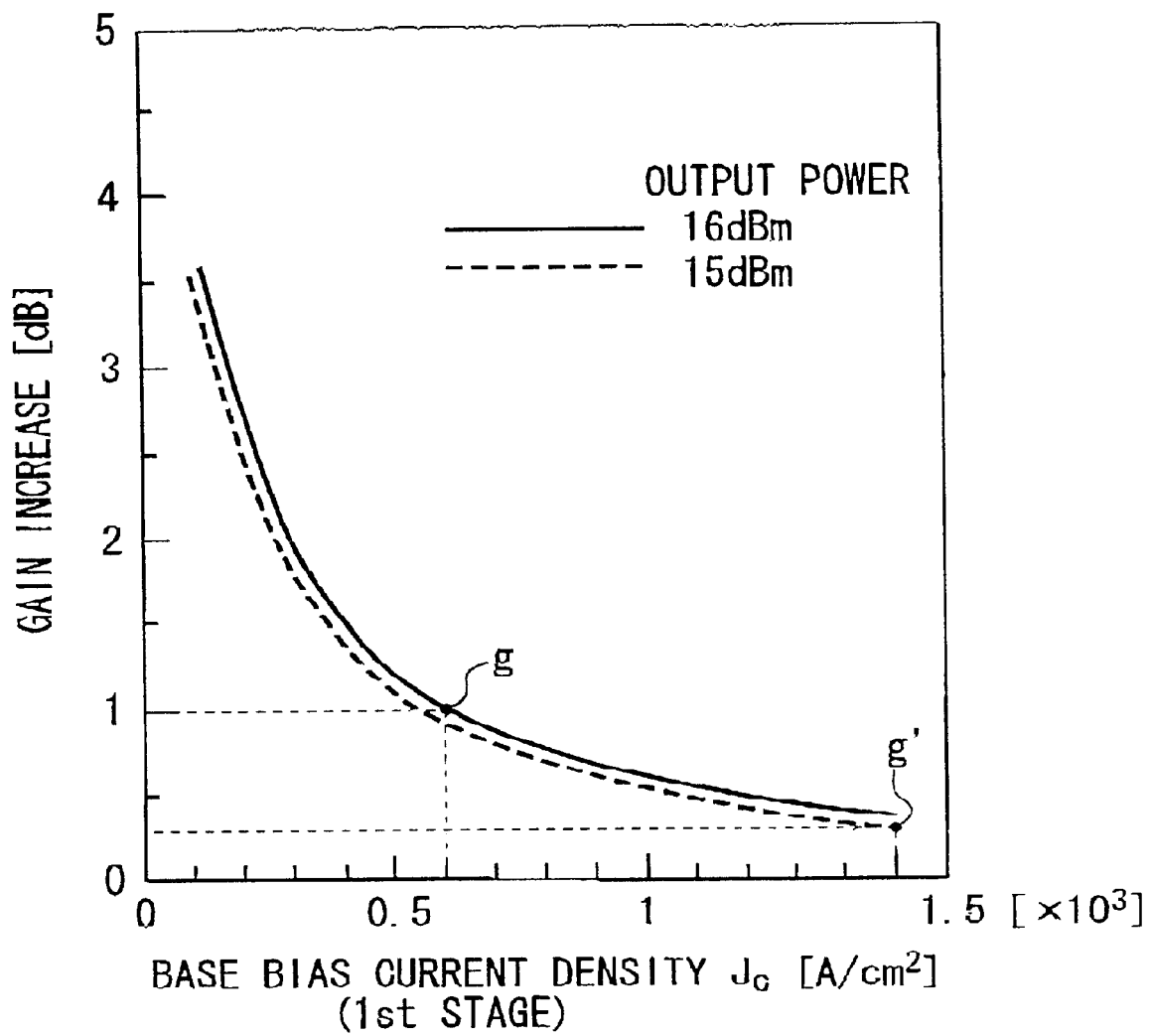
FIG. 7 is a graph showing the relationship between the gain increase and the base bias current density of the first amplifier stage of the power amplifier according to the second embodiment of FIG. 5.

As seen from FIG. 7, the gain increase of the transistor 11 at the output power of the transistor 11 of 15 dBm or 16 dBm is adjusted within a considerably wide range by changing the base bias current density Jc from $1.5 \times 10^3$ A/cm$^2$ to $1.0 \times 10^2$ A/cm$^2$.

The power amplifier 10A according to the second embodiment of FIG. 5 is the combination of the first amplifier stage comprising the transistor 11 whose gain is changeable by the gain control circuit 26, and the second amplifier stage comprising the transistor 12. In other words, the characteristics of the amplifier 10A are given by the combination of the characteristics of the first-stage transistor 11 (FIG. 6) and the characteristics of the second-stage transistor 12 (FIG. 2).

As shown by the points a and b in FIG. 2, when the output power Po of the power amplifier 10A (i.e., the second-stage transistor 12) is approximately 28 dBm within the vicinity of its peak region, the input power to the transistor 12 is approximately 16 dBm. At this time, the transistor 12 has a gain compression of more than 1 dBm.

On the other hand, as seen from the point g in FIG. 7 when the output power of the first-stage transistor 11 (i.e., the input power for the second-stage transistor 12) is approximately 16 dBm, the gain increase of the transistor 11 is 1 dBm at the base bias current density Jc of $6.0 \times 10^2$ A/cm$^2$. As a result, the gain compression of more than 1 dBm of the second-stage transistor 12 is substantially canceled by the gain increase of 1.0 dBm of the first-stage transistor 11, even if back-off is not applied to the transistor 12.

Similarly, as shown by the points a' and b' in FIG. 2, when the output power Po of the power amplifies 10A (i.e., the second-stage transistor 12) is approximately 27.5 dBm, the input power to the transistor 12 is approximately 15 dB. At this time, the transistor 12 has a gain compression of more than 0.4 dBm.

On the other hand, as seen from the point g' in FIG. 7, when the output power of the first-stage transistor 11 is approximately 15 dBm, the gain increase of the transistor 11 is 0.4 if the base bias current density Jc for the transistor 11 is set at $1.5 \times 10^3$ A/cm$^2$. As a result, the gain compression of approximately 0.4 dBm of the second-stage transistor 12 is substantially canceled by the gain increase of 0.4 dBm of the first-stage transistor 11, even if back-off is not applied to the transistor 12.

With the power amplifier 10A according to the second embodiment, as understood from the above description, there are the same advantages as those in the amplifier 70 of the first embodiment. However, the amplifier 10A has an additional advantage that the overall gain compression of the amplifier 10A can be substantially canceled easily.

Specifically, the base bias current density Jc for the first-stage transistor 11 is controlled or adjusted by the gain control circuit 26 to change the gain increase of the transistor 11. Therefore, it is easy that the gain compression of the second-stage transistor 12 is substantially canceled. This means that the overall gain compression of the amplifier 10A can be substantially canceled easily.

Like the first embodiment, the power addition efficiency of the amplifier 10A is strongly dependent on the gain of the second-stage transistor 12. The decrease of the power addition efficiency of the amplifier 10A is canceled or suppressed because of cancellation of the gain compression of the transistor 12. This means that the power addition efficiency is enhanced or improved.

Preferably, for example, the base bias current density Jc for the transistor 11 is set at an optimum value in advance corresponding to the value of the output power Po of the amplifier 10A. The gain control circuit 26 detects or monitors continuously the value of the output power Po. According to the value of the power Po detected or monitored, the circuit 26 adjusts the base bias voltage at the base bias terminal 15 to set the base bias current density Jc at a desired or optimum value, thereby adjusting the gain increase of the transistor 11.

When the output power Po of the amplifier 10A is approximately 13 dBm or less (i.e., when the second-stage transistor 12 operates in its linear region without any gain compression), there is no need to cause gain increase in the first-stage transistor 11. Therefore, for example, the gain control circuit 26 controls the base bias current density Jc to be equal to $2.0 \times 10^3$ A/cm$^2$ or greater, thereby driving the transistor 11 in its linear region without any gain deviation. In this case, low distortion of the amplifier 10A is maintained.

On the other hand, when the output power Po of the amplifier 10A is greater than 13 dBm, the second-stage transistor 12 does not operate in its linear region and thus, it generates some gain compression. In this case, the gain control circuit 26 controls the base bias current density Jc to be equal to $1.5 \times 10^3$ A/cm$^2$ or less, causing some gain increase in the transistor 11 to decrease or cancel the gain compression in the transistor 12. Thus, the low distortion of the amplifier 10A is maintained even if the output power Po is increased from 13 dBm to more.

As explained here, in the power amplifier 10A of the second embodiment, the gain increase of the first-stage transistor 11 is adjusted by the gain control circuit 26 according to the output power Po of the amplifier 10A. Thus, the low distortion characteristic of the amplifier 10A can be expanded.

Third Embodiment

Figure 8:
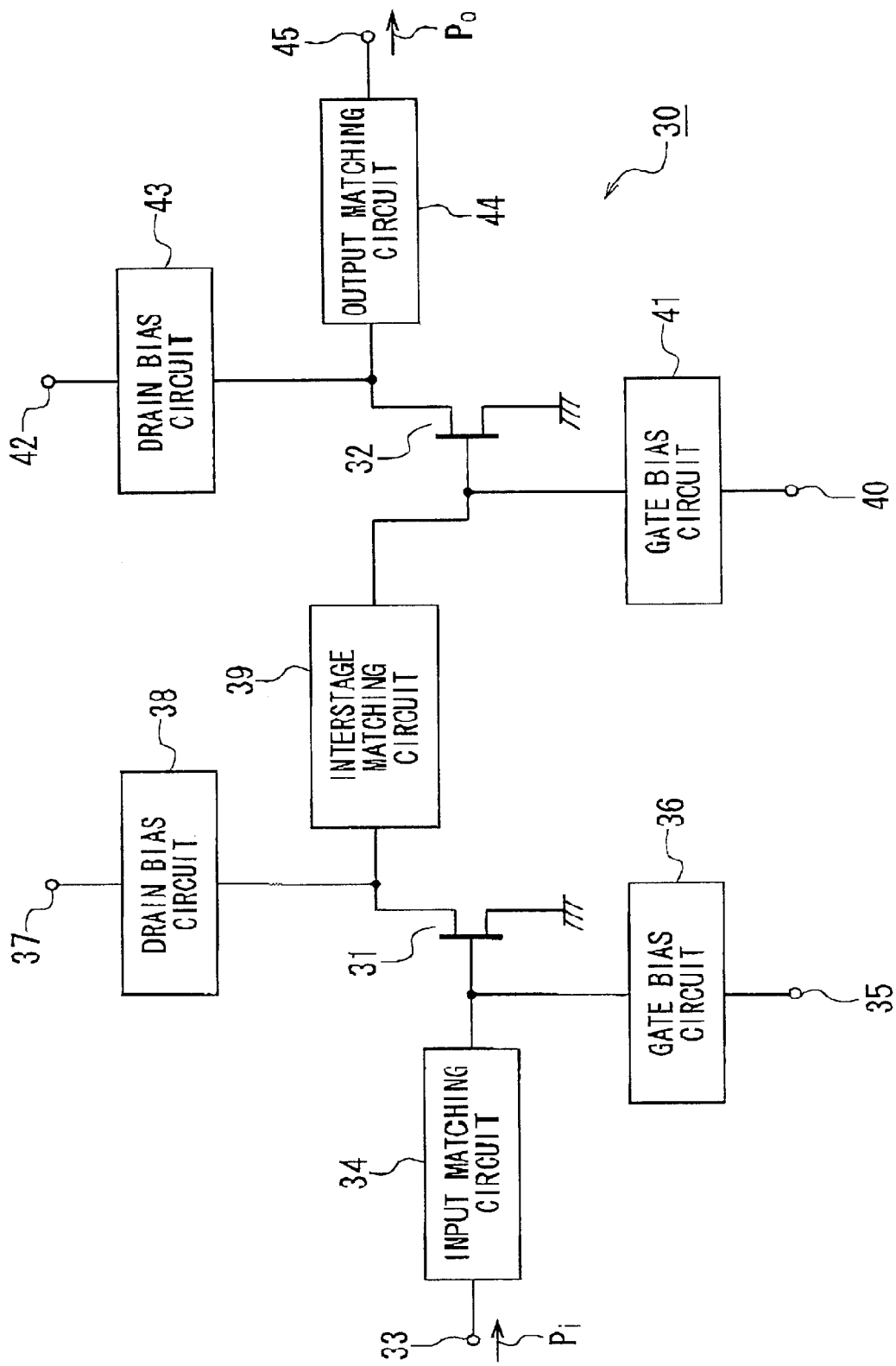
FIG. 8 is a functional block diagram showing the configuration of a high-frequency power amplifier according to a third embodiment of the invention, in which FETs are used for the first and second amplifier stages.

FIG. 8 shows the configuration of a high-frequency power amplifier 30 according to a third embodiment of the invention. This amplifier 30 has substantially the same configuration as the amplifier 10 of the first embodiment of FIG. 1 except that n-channel FETs 31 and 32 are provided instead of the bipolar transistors 11 and 12, respectively.

As shown in FIG. 8, the power amplifier 30 according to the third embodiment comprises a first amplifier stage having a n-channel FET 31 and a second amplifier stage having a n-channel FET 32. The first and second stages are connected to each other by way of an interstage matching circuit 39 for impedance matching between these two stages. The amplifier 30 receives an input power Pi at an input terminal 33 to amplify the same in the first and second amplifier stages, generating an output power Po at an output terminal 45. Each of the FETs 31 and 32 has a common-source configuration and serves as an amplifier.

As each of the FETs 31 and 32, a Metal Field-Effect Transistors (MESFET) is preferably used.

The change of the gain of the FET 32 at the second amplifier stage is suppressed or canceled by the change of the gain of the FET 31 at the first amplifier stage within a specific range of the input power Pi. In other words, as the input power Pi increases, the gain of the FET 31 increases so as to suppress or cancel the gain compression of the FET 32 within a specific range of the input power Pi.

Moreover, the amplifier 30 comprises an input matching circuit 34, a gate bias circuit 36, and a drain bias circuit 38 in the first amplifier stage. The input matching circuit 34, which is provided between the input terminal 33 and the gate of the FET 31, serves to match the input impedance of the amplifier 30 to the signal source impedance of the input power Pi. The gate bias circuit 36, which is provided between a gate bias terminal 35 and the gate of the FET 31, supplies a gate bias voltage to the gate of the FET 31. The drain bias circuit 38, which is provided between a drain bias terminal 37 and the drain of the FET 31, supplies a drain bias current to the drain of the FET 31.

Similarly, the amplifier 30 further comprises a gate bias circuit 41, a drain bias circuit 43, and an output matching circuit 44 in the second amplifier stage. The gate bias circuit 41, which is provided between a gate bias terminal 40 and the gate of the FET 32, supplies a gate bias voltage to the gate of the FET 32. The drain bias circuit 43, which is provided between a drain bias terminal 42 and the drain of the FET 32, supplies a drain bias current to the drain of the FET 32. The output matching circuit 44, which is provided between the drain of the FET 32 and the output terminal 45, serves to match the output impedance of the amplifier 30 to the input impedance of a circuit or device (not shown) that receives the output power Po.

The interstage matching circuit 39 is provided between the drain of the FET 31 in the first stage and the gate of the FET 32 in the second stage.

Each of the matching circuits 34, 39, and 44 and the bias circuits 36, 38, 41, and 43 is formed mainly be passive elements or components such as resistors, capacitors, and inductors.

The operation of the power amplifier 30 according to the third embodiment is the same as the power amplifier 10 of the first embodiment. Therefore, the explanation is omitted here.

With the power amplifier 30 according to the third embodiment, it is obvious that there are the same advantages as those in the first embodiment.

Fourth Embodiment

Figure 9:
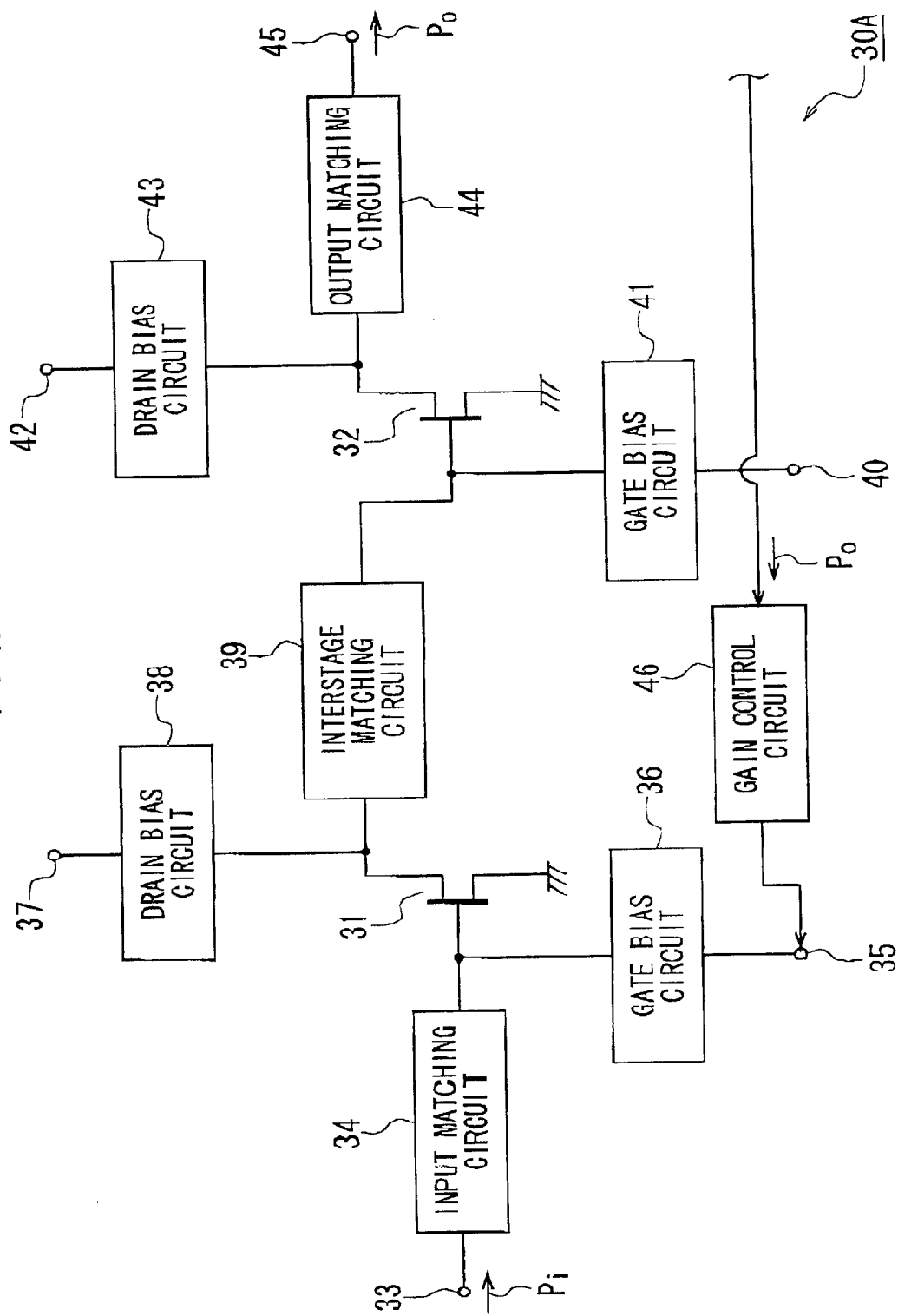
FIG. 9 is a functional block diagram showing the configuration of a high-frequency power amplifier according to a fourth embodiment of the invention, in which FETs are used as for the first and second amplifier stages and a gain control circuit is provided.

FIG. 9 shows the configuration of a high-frequency power amplifier 30A according to a fourth embodiment of the invention. This amplifier 30A has substantially the same configuration as the amplifier 10A of the second embodiment or FIG. 5 except that n-channel FETs 31 and 32 are provided instead of the bipolar transistors 11 and 12, respectively. In other words, this amplifier 30A has substantially the same configuration as the amplifier 30 of the third embodiment of FIG. 9 except that a gain control circuit 46 is additionally provided.

The operation of the power amplifier 30A according to the fourth embodiment is substantially the same as the power amplifier 10A of the second embodiment. Therefore, the explanation is omitted here.

With the power amplifier 30A according to the fourth embodiment, it is obvious that there are the same advantages as those in the second embodiment.

Variations

Needless to say, the invention is not limited to the above-described first to fourth embodiments. Any change may be added to these embodiment.

For example, each of the power amplifiers 10, 10A, 30, and 30A has two amplifier stages in the first to fourth embodiments. However, the invention is not limited to these cases. The power amplifier circuit of the invention may be configured with three amplifier stages or more connected in cascade. In this case, it is not always necessary that the amplifier stage with a gain compression is adjacent to the amplifier stage with a gain increase. For example, the fourth amplifier stage has a gain compression while the second amplifier stage has a gain increase. It is preferred that the amplifier stage with a gain compression is adjacent to the amplifier stage with a gain increase, because implementation of the invention is easily accomplished.

Moreover each of the first and second amplifier stages employs the common-emitter or common-source configuration in the first to fourth embodiments. However, needless to say, any other configuration (e.g., the common-base or common-gate configuration) may be used for this purpose if it has an amplification function. Two or more transistors may be used for each of the amplifier stages.

It is preferred that a bipolar transistor or transistors is/are used for the prior amplifier stage rather than a FET. This is because a bipolar transistor or transistors provide(s) greater gain increase than a FET or FETs.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A power amplifier comprising:
   (a) first to n-th amplifier stages connected in cascade, where n is an integer greater than unity;
   (b) a k-th one of the amplifier stages receiving a k-th input signal power to produce a the output signal power, where k is an integer satisfying a relationship of $1 \leq k \leq n$;
   the k-th amplifier stage including a transistor with an amplification function;
   the transistor having a gain change in a range of the k-th input signal power or the k-th output signal power;
   (c) a m-th one of the amplifier stages receiving a m-th input signal to produce a m-th output signal, where m is an integer satisfying a relationship of $1 \leq m \leq n$ and $m \neq k$;
   the m-th amplifier stage including a transistor with an amplification function;
   the transistor having a gain change in a range of the m-th input signal power or the m-th output signal power; and
   (d) the gain change of the transistor of the m-th amplifier stage being decreased or cancelled by the gain change of the transistor of the k-th amplifier stage.

2. The amplifier according to claim 1, wherein the transistor of the k-th amplifier stage has a gain increase in the range of the k-th input signal power or the k-th output signal power while the transistor of the m-th amplifier stage has a gain compression.

3. The amplifier according to claim 1, wherein each of the transistors of the k-th and m-th amplifier stages is a bipolar transistor with common-emitter configuration.

4. The amplifier according to claim 1, wherein the gain change of the transistor of the k-th amplifier stage is caused by changing its base bias current.

5. The amplifier according to claim 1, wherein the gain change of the transistor of the m-th amplifier stage is a gain compression near peak of the m-th input or output signal power;
   and the gain change of the transistor of the k-th amplifier stage is a gain increase near peak of the k-th input or output signal power.

6. The amplifier according to claim 1, wherein each of the transistors of the k-th and m-th amplifier stages is a FET with common-source configuration.

7. The amplifier according to claim 1, wherein the gain change of the transistor of the k-th amplifier stage is caused by changing its gate bias voltage.

8. The amplifier according to claim 1, further comprising a gain controller for controlling a gain of the transistor of the k-th amplifier stage responsive to the k-th output signal power or a n-th output signal power produced by the n-th amplifier stage.

9. The amplifier according to claim 8, wherein the transistor of the k-th amplifier stage has a gain increase in the range of the k-th input signal power or the k-th output signal power while the transistor of the m-th amplifier stage has a gain compression.

10. The amplifier according to claim 1, wherein $m=k+1$ and k has a value represented as $1 \leq k \leq (n-1)$ such that the m-th and k-th amplifier stages are adjacent to one another, said k-th amplifier stage preceding said m-th amplifier stage, the k-th output signal power being the m-th input signal.

11. The amplifier according to claim, 10, wherein the gain change of the transistor of the (k+1)-th amplifier stage is a gain compression near peak of the (k+1)-th input or output signal power;
    and the gain change of the transistor or the k-th amplifier stage is a gain increase near peak of the k-th input or output signal power.

12. A power amplifier comprising:
    (a) first to n-th amplifier stages connected in cascade, where n is an integer greater than unity;
    (b) a k-th one of the amplifier stages receiving a k-th input signal power to produce a k-th output signal power, where k is an integer satisfying a relationship of $1 \leq k \leq (n-1)$;
    the k-th amplifier stage including a transistor with an amplification function;
    the transistor having a gain change in a range of the k-th input signal power or the k-th output signal power;
    (c) a (k+1)-th one of the amplifier stages receiving the k-th output signal as an input signal to produce a (k+1)-th output signal;
    the (k+1)-th amplifier stage including a transistor with an amplification function;
    the transistor having a gain change in a range of the (k+1)-th input signal power or the (k+1)-th output signal power; and
    (d) the gain change of the transistor of the (k+1)-th amplifier stage being decreased or cancelled by the gain change of the transistor of the k-th amplifier stage.

13. The amplifier according to claim, 12, wherein the transistor of the k-th amplifier stage has a gain increase in the range of the k-th input signal power or the k-th output signal power while the transistor of the (k+1)-th amplifier stage has a gain compression.

14. The amplifier according to claim 12, wherein each of the transistors of the k-th and (k+1)-th amplifier stages is a bipolar transistor with common-emitter configuration.

15. The amplifier according to claim 14, wherein the gain change of the transistor of the k-th amplifier stage is caused by changing its base bias current.

16. The amplifier according to claim 15, wherein the gain change of the transistor of the (k+1)-th amplifier stage is a gain compression near peak of the (k+1)-th input or output signal power;
    and the gain change of the transistor of the k-th amplifier stage is a gain increase near peak of the k-th input or output signal power.

17. The amplifier according to claim 12, further comprising a gain controller for controlling a gain of the transistor of the k-th amplifier stage responsive to the k-th output signal or a n-th output signal power produced by the n-th amplifier stage.

18. The amplifier according to claim 17, wherein the gain controller controls the gain change of the transistor of the k-th amplifier stage by changing its base bias current.

* * * * *